US012593713B2

United States Patent
(12) United States Patent
Wang et al.
(10) Patent No.: US 12,593,713 B2
(45) Date of Patent: Mar. 31, 2026

(54) SELF-DENSIFYING INTERCONNECTION BETWEEN A HIGH-TEMPERATURE SEMICONDUCTOR DEVICE SELECTED FROM GaN OR SiC AND A SUBSTRATE

(71) Applicant: Nano and Advanced Materials Institute Limited, Hong Kong (HK)

(72) Inventors: Yuechen Wang, Hong Kong (HK); Tao Xu, Hong Kong (HK); Li Fu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 554 days.

(21) Appl. No.: 18/154,033

(22) Filed: Jan. 12, 2023

(65) Prior Publication Data

US 2023/0230950 A1 Jul. 20, 2023

Related U.S. Application Data

(60) Provisional application No. 63/300,043, filed on Jan. 16, 2022.

(51) Int. Cl.

*H10W 72/30* (2026.01)
*H10W 72/00* (2026.01)
(Continued)

(52) U.S. Cl.

CPC ......... *H10W 72/30* (2026.01); *H10W 72/073* (2026.01); *H10W 72/01365* (2026.01);
(Continued)

(58) Field of Classification Search

CPC ........ H01B 1/22; H01B 5/14; H01B 13/0016; H01L 24/29; H01L 24/32; H01L 24/83;
(Continued)

(56) References Cited

U.S. PATENT DOCUMENTS 4,419,279 A * 12/1983 Abrams ............... H01G 4/0085 428/404
6,072,716 A * 6/2000 Jacobson ............. H10N 70/021 365/163
(Continued)

FOREIGN PATENT DOCUMENTS

CN 101214547 A 7/2008
CN 105127609 A 12/2015
(Continued)

OTHER PUBLICATIONS

CN105127609A "Copper/silver core-shell nanoparticles low-temperature sintering composite solder paste and preparation method thereof" (Mar. 8, 2017) (pp. 1-8) English Translation (Year: 2017).*
(Continued)

*Primary Examiner* — Khiem D Nguyen
(74) *Attorney, Agent, or Firm* — IDEA Intellectual Limited; Sam T. Yip

(57) ABSTRACT

A self-densifying interconnection is formed between a high-temperature semiconductor device selected from a GaN or SiC-based device and a substrate. The interconnection includes a matrix of micron-sized silver particles in an amount from approximately 10 to 60 weight percent; the micron-sized silver particles having a particle size ranging from approximately 0.1 microns to 15 microns. Bonding particles are used to chemically bind the matrix of micron-sized silver particles. The bonding particles are core silver nanoparticles with in-situ formed surface silver nanoparticles chemically bound to the surface of the core silver nanoparticles and, at the same time, chemically bound to the matrix of micron-sized silver particles. The bonding particles have a core particle size ranging from approximately 10 to approximately 100 nanometers while the in-situ
(Continued)

formed surface silver nanoparticles have a particle size of approximately 3-9 nanometers.

11 Claims, 7 Drawing Sheets

(51) Int. Cl.
*H10W 72/90* (2026.01)
*H10W 90/00* (2026.01)

(52) U.S. Cl.
CPC ................. *H10W 72/07311* (2026.01); *H10W 72/07331* (2026.01); *H10W 72/07355* (2026.01); *H10W 72/325* (2026.01); *H10W 72/351* (2026.01); *H10W 72/352* (2026.01); *H10W 72/353* (2026.01); *H10W 72/354* (2026.01); *H10W 72/851* (2026.01); *H10W 72/884* (2026.01); *H10W 72/90* (2026.01); *H10W 72/952* (2026.01); *H10W 90/734* (2026.01)

(58) Field of Classification Search
CPC . H01L 2924/05342; H01L 2924/20104; H01L 2924/04642; H01L 2924/0715; H01L 2924/05442; H01L 2924/05432; H01L 2224/29339; H01L 2224/8384; H01L 2224/2929; H01L 2224/83048; H10W 72/30; H10W 72/073; H10W 72/325; H10W 72/351; H10W 72/884; H10W 90/734
See application file for complete search history.

(56) References Cited

U.S. PATENT DOCUMENTS

| | | | | |
|---|---|---|---|---|
| 8,257,795 | B2 | 9/2012 | Lu et al. | |
| 10,065,273 | B1 | 9/2018 | Oestreicher et al. | |
| 2017/0025374 | A1 | 1/2017 | Fujiwara et al. | |
| 2017/0144220 | A1* | 5/2017 | Suganuma | H01B 1/22 |
| 2017/0243849 | A1* | 8/2017 | Sasaki | C09J 11/06 |

FOREIGN PATENT DOCUMENTS

| | | | |
|---|---|---|---|
| CN | 108526751 | A | 9/2018 |
| CN | 106133894 | B | 11/2018 |
| CN | 109773211 | A | 5/2019 |
| CN | 110508970 | A | 11/2019 |
| EP | 2883922 | A1 | 6/2015 |
| WO | 2009111393 | A2 | 9/2009 |

OTHER PUBLICATIONS

Office Action of the corresponding China patent application No. 202310063633.6 mailed on Jun. 28, 2024.
Evan A. Hueners, et al, "Energy and Eco-Sustainability using Pressure-less Silver Sintering for RF Power Electronics", IMAPS 2019—52nd International Symposium on Microelectronics.
Wang, Tao et al. "Shrinkage and Sintering Behavior of a Low-Temperature Sinterable Nanosilver Die-Attach Paste." Journal of Electronic Materials 41 (2012): 2543-2552.
Mingyu Li et al., "Bimodal Sintered Silver Nanoparticle Paste with Ultrahigh Thermal Conductivity and Shear Strength for High Temperature Thermal Interface Material Applications", ACS Applied Materials & Interfaces 2015 7 (17), 9157-9168.
Notice of Allowance of the corresponding China patent application No. 202310063633.6 mailed on Dec. 23, 2024.

* cited by examiner

SELF-DENSIFYING INTERCONNECTION BETWEEN A HIGH-TEMPERATURE SEMICONDUCTOR DEVICE SELECTED FROM GaN OR SiC AND A SUBSTRATE

CROSS-REFERENCE TO RELATED APPLICATION

The present application claims priority to U.S. Provisional Patent Application 63/300,043 filed 16 Jan. 2022, the disclosure of which is incorporated by reference herein.

FIELD OF THE INVENTION

The present invention relates to self-densifying nano-silver pastes and, more particularly, to self-densifying nano-silver pastes for connections in high-power electronic devices.

BACKGROUND

Metal nanoparticles and their related inks/pastes have attracted broad interest in the printed electronics industry due to their unique properties as a result of their reduced particle size and increased surface area. More recently, metal nanoparticle inks have been used to directly print fine conductive patterns using inkjet printing methods. This particular method requires that the ink contains a high concentration of small nanoparticles which can be well dispersed in solvents. For example, WO2009/111393 describes a conductive ink that includes metallic nanoparticles, a polymeric dispersant and a solvent, and further discloses that the metallic nanoparticles include about 10 weight percent to about 60 weight percent of the ink.

In semiconductor packaging, a die attach material makes an electrical and/or thermal connection between a semiconductor device and its substrate/package. Traditionally, lead-based solders have been used to form this connection. The high temperature lead-based solder alloys for die attach have been regarded as mature products by the semiconductor industry, however, lead-based materials raise environmental and health concerns. Due to environmental regulations, lead-free solders are required for use in packaging in some regions. Lead-free solder alloys generally have low melting temperatures and are susceptible to thermal fatigue and creep, creating long-term reliability issues. Gold-based lead-free solder alloys possess acceptable electrical and thermal properties but are too expensive for use in most devices.

High-power semiconductor devices have higher breakdown voltages, possess lower switching losses, are capable of higher current densities, and can operate at higher temperatures. These high-power devices involve the use of wide band gap materials such as silicon carbide (SiC) and gallium nitride (GaN), both of which may operate at temperatures above 300° C. Due to the increased requirements of high heat dissipation for these wide band gap materials in high-power electronic devices, eutectic solder alloys or conventional die-attach adhesives are not appropriate as die-attach materials due to limited heat dissipation capability (thermal conductivity 30~60 W/mK) and low melting points. A bonding line using these conventional materials shows low thermal stability and fails at high operating temperatures. As a result, high-power electronics may need to limit their power due to the low thermal conductivity of the bonding layer material.

Silver sintering provides a strong bond between device and substrate. In the sintering process, when the silver material is heated under optimal circumstances (pressure, temperature and time), its form will change from powder to a solid structure. Compared to traditional solder material, silver sintering results in a more reliable interconnect layer with significantly enhanced performance and lifetime, while being more energy efficient and placing less stress on a semiconductor package.

Silver nanoparticles have been used in interconnections of semiconductor devices and substrates due to their high melting temperature (961° C.) and low sintering temperature. With its superior thermal and electrical conductivity, silver has the ability to decrease the junction temperature (Tj) of a device up to 100° C. When particle size is reduced down to nanoscale, some special characteristics result, such as lower melting temperature, much higher surface energy, and higher diffusion coefficient; these characteristics are significantly different from bulk silver.

One of the advantages of sintered nano silver is that it can form a joint at temperatures comparable to lead-based solders; however, following sintering, the joint will not melt until the temperature exceeds the melting point of silver (961° C.). The nano silver materials also provide the same excellent thermal, electrical, and mechanical performance as those of bulk silver. The sintered nano silver joints produced at relatively low temperatures can be used at elevated temperatures (beyond 500° C.) at which conventional solder joints fail.

Most uses of silver nanoparticles involve both heat and pressure to achieve a dense interconnection; a pressure-assisted sintering process requires a large capital investment for pressure-applying equipment and has a very low manufacturing throughput. The high pressure may also result in die cracking.

U.S. Pat. No. 8,257,795 relates to a paste whose metal particles are entirely nanoparticles with optional use of pressure during heating. However, a paste made entirely from nanoparticles may have difficult workability. In one aspect, workability is reduced as nanoparticles agglomerate easily, causing clogs in paste dispensers and affecting the density of the final bond. Further, metal nanoparticles are typically more expensive than particles having a micron-range size, increasing the paste cost and the overall cost of the device using the paste. Table 1 compares the performance of different conventional die attach materials.

TABLE 1

Performance of Conventional Die Attach Materials

| Die Attach Material | Processing Temperature | Max. use temperature | Electrical conductivity $10^5$ (Ω-cm)$^{-1}$ | Thermal conductivity (W/m · K) | Die-shear Strength (MPa) | RoHS Comp. |
|---|---|---|---|---|---|---|
| High Lead-tin solder | 340° C. | <280° C. | 0.45 | 23 | 15 | X |

TABLE 1-continued

| Performance of Conventional Die Attach Materials | | | | | | |
|---|---|---|---|---|---|---|
| Die Attach Material | Processing Temperature | Max. use temperature | Electrical conductivity $10^5$ $(\Omega\text{-cm})^{-1}$ | Thermal conductivity (W/m · K) | Die-shear Strength (MPa) | RoHS Comp. |
| Lead-free solder | 260° C. | <225° C. | 0.75 | 70 | 35 | ✓ |
| Gold-tin solder | 310° C. | <280° C. | 0.625 | 58 | 30-60 | ✓ |
| Silver Epoxy | 100-200° C. | <200° C. | 0.1 | 10 | 10-40 | ✓ |
| Nano Silver | <260° C. | <961° C. | 3.8 | 200 | 20-40 | ✓ |

Thus, there is a need in the art for improved die attachment materials; such improved die attachment materials could be used for forming an interconnection between high-temperature semiconductor devices, such as GaN or SiC-based devices, and substrates.

SUMMARY OF THE INVENTION

The present invention provides a self-densifying interconnection between a high-temperature semiconductor device selected from a GaN or SiC-based device and a substrate. The interconnection includes a matrix of micron-sized silver particles in an amount from approximately 10 to 60 weight percent; the micron-sized silver particles have a particle size ranging from approximately 0.1 microns to 15 microns. Bonding particles are used to chemically bind the matrix of micron-sized silver particles. The bonding particles are core silver nanoparticles with smaller in-situ formed surface silver nanoparticles chemically bound to the surface of the core silver nanoparticles and, at the same time, chemically bound to the matrix of micron-sized silver particles. The bonding particles have a core particle size ranging from approximately 10 to approximately 100 nanometers while the in-situ formed surface silver nanoparticles have a particle size of approximately 3-9 nanometers.

In a further aspect, the micron-sized silver particles are silver flakes or approximately spherical silver particles.

In a further aspect, the substrate includes a layer of silver or gold having a thickness of approximately 0.1 to 0.3 micron.

In another aspect, the present invention provides a trimodal self-densifying silver interconnection paste. The paste includes 10-60 weight percent of approximately micron-sized matrix silver particles with an average particle size from 0.1 microns to 15 microns. The paste further includes 10-60 weight percent of bonding silver nanoparticles, the bonding silver nanoparticles having core silver nanoparticles with a core nanoparticle size of approximately 10-100 nanometers. The core silver nanoparticles have a capping polymeric layer including a silver salt precursor dissolved or suspended therein. The silver salt precursor forms surface silver nanoparticles adhering to the surface of the core silver nanoparticles; the core silver nanoparticles having a particle size from approximately 10 to approximately 100 nanometers such that a composite bonding silver nanoparticle is formed with core and surface nanoparticles of 3-9 nm to bind to the larger matrix silver particles. The paste further includes 10-20 weight percent of at least one reductive solvent and 0.1-1 weight percent of anti-oxidization reducing agents.

In another aspect, the paste may include 30-50 weight % of the matrix particles, 10-30 percent of the bonding particles, and 20-40 percent of solvent.

In another aspect, the paste may include 20-50 weight % of the matrix particles, 30-40 percent of the bonding particles, and 20-30 percent of solvent.

In another aspect, the paste may include 30-40 weight % of the matrix particles, 30-40 percent of the bonding particles, and 10-30 percent of solvent.

In another aspect, the paste may include 20-40 weight % of the matrix particles, 30-50 percent of the bonding particles, and 10-20 percent of solvent.

The trimodal silver interconnection paste may further include 0.1-1 weight percent of a non-conductive filler.

In the trimodal silver interconnection paste, the approximately micron-sized matrix silver particles may be silver flakes or approximately spherical silver particles.

The trimodal silver interconnection paste may use polyvinyl pyrrolidone as the capping polymeric layer.

In the trimodal silver interconnection paste, the silver salt may be one or more of silver nitrate, silver chloride, silver acetate, or silver sulfate.

In the trimodal silver interconnection paste, the at least one reductive solvent may be one or more or ethylene glycol, diethylene glycol, triethylene glycol and polyethylene glycol.

In the trimodal silver interconnection paste the anti-oxidization reducing agent may be one or more of citric acid, caffeic acid, malic acid, or a dicarboxylic acid.

In the trimodal silver interconnection paste, the non-conductive filler may be one or more of SiC, $SiO_2$ or $Al_2O_3$, $ZrO_2$, silicone resin microsphere particles, or other ceramic and polymer particles that are stable at a sintering temperature.

In a further aspect, the present invention also provides a method of forming a self-densifying interconnection between a high-temperature semiconductor device selected from a GaN or SiC-based device and a substrate. The paste is positioned between a semiconductor device and a substrate, and a multistep heating process is performed. The trimodal self-densifying silver interconnection paste is heated to a first temperature between approximately 80 to 120° C. for a period of time sufficient to in situ form the surface silver nanoparticles on the surface of the core silver nanoparticles.

The paste is heated to a second temperature between approximately 120 to 150° C. for a period of time sufficient to remove an organic layer on the matrix silver particles. The paste is heated to a third temperature between approximately 150 to 200° C. for a period of time sufficient to remove residual solvent. Finally, the paste is heated to a fourth temperature between approximately 200 to 260° C. for a period of time sufficient to sinter the silver interconnection paste to form an interconnection.

In a further aspect, the period of time sufficient to form the surface silver nanoparticles in situ on the surface of the core silver nanoparticles is approximately 10 to 30 minutes.

In a further aspect, the period of time sufficient to remove an organic layer on the matrix silver particles is approximately 10 to 30 minutes.

In a further aspect, the period of time sufficient to sinter the silver interconnection paste to form an interconnection is approximately 30-90 minutes.

In a further aspect, the interconnection is formed without adding pressure.

DETAILED DESCRIPTION

Overview

Figure 3:
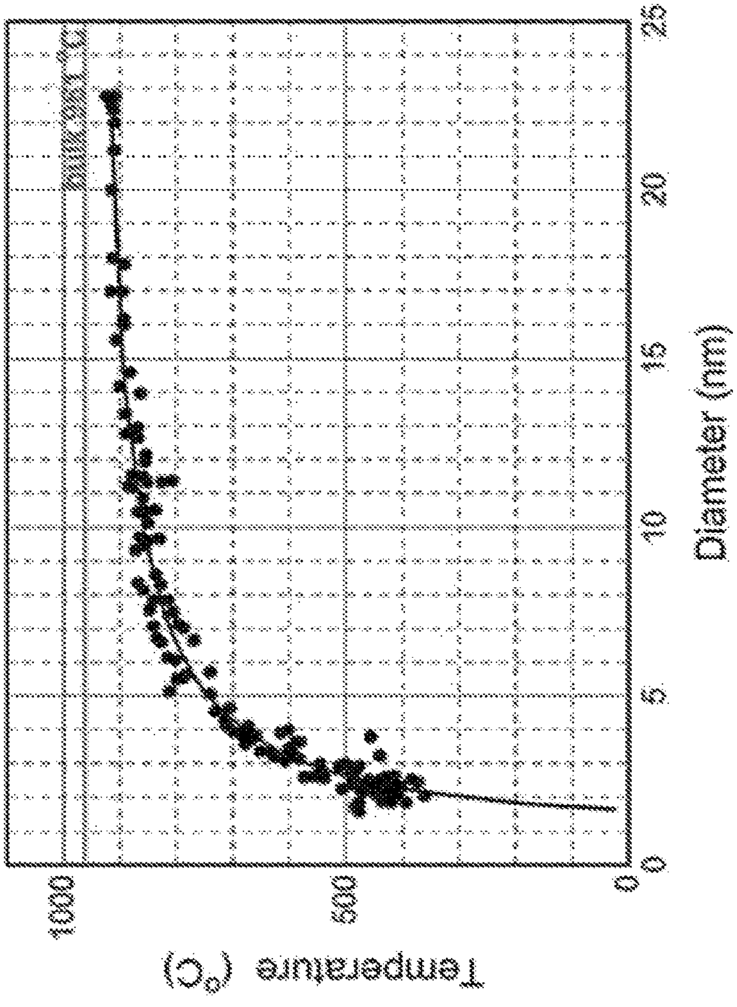
FIG. 3 is a plot of melting temperature vs. particle diameter for silver.
Figure 4:
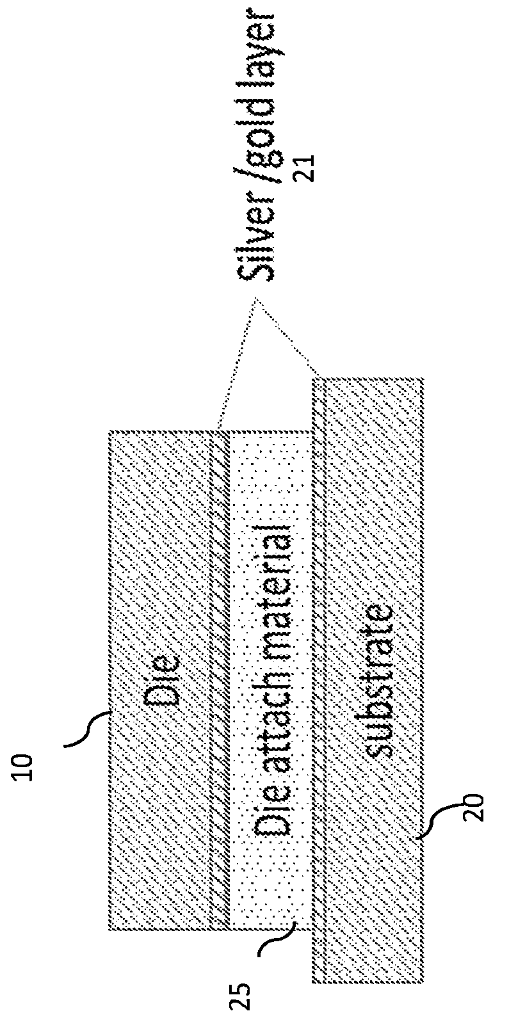
FIG. 4 shows a bond according to an embodiment.

Silver is soft, very ductile and a malleable metal that has high electrical and thermal conductivity. Silver nanoparticle, generally small than 100 nm, does not oxidize in air and it is stable in water. Silver nanoparticles are increasingly used in various fields, including medical, food, health care, consumer, and industrial purposes, due to their unique physical and chemical properties. These include optical, electrical, thermal, electrical, and biological properties. As the size range of silver transitions to the nanoscale, higher specific surface energy and increasing surface-to-volume ratio in the nanostructured silver enhances their sensitivity to heat. The surface diffusion coefficient increases with the decrease of particle size suggesting a higher specific surface energy of nanoparticles than that of the micro-particles or bulk materials. The driving force for diffusion is inversely proportional to the size of the particles. A high driving force results in a decrease in the sintering temperature of silver nanoparticles. FIG. 3 depicts the melting temperature of silver particles of different sizes, showing the dramatic decrease in melting temperature for particles having a diameter of less than 10 nm.

Figure 1:
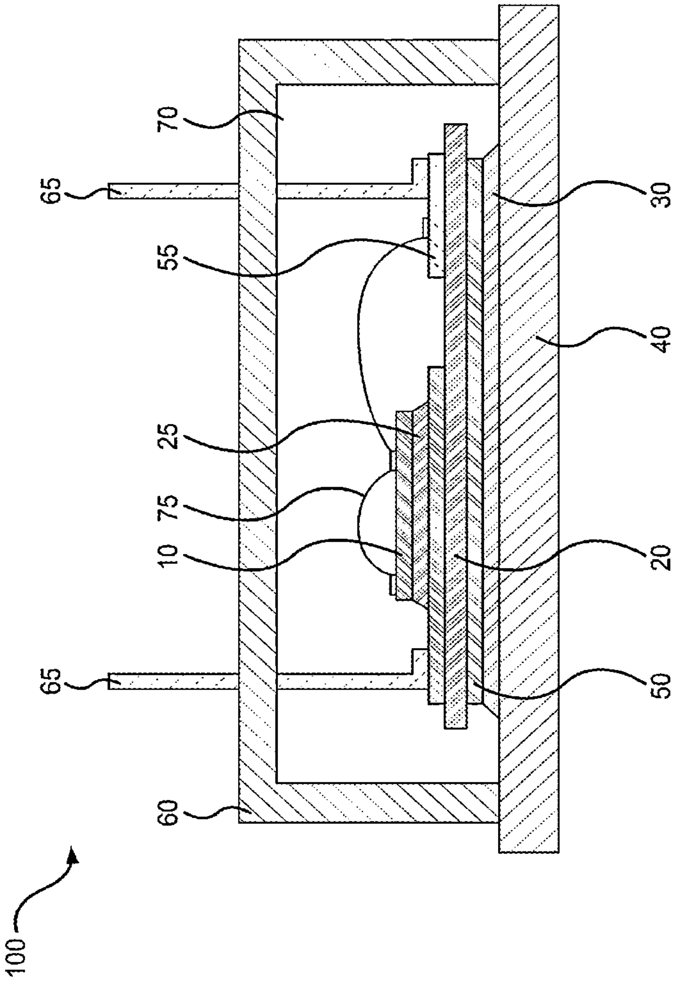
FIG. 1 is a schematic depiction of a packaged semiconductor device according to an embodiment.

FIG. 1 schematically depicts a semiconductor package 100 employing the interconnection material of the present invention. The semiconductor package includes device 10, which may be a GaN-based or SiC-based device, and a substrate 20 which may be a ceramic material or other material that can withstand elevated temperatures. The device is connected to the substrate through interconnect layer/die attach layer 25. The substrate 20 may include upper substrate metallization layer 55 and lower substrate metallization layer 50. The substrate 20 may be attached to a base plate 40 through an attachment solder 30. The package is bounded by an optional protective shell 60 filled with an optional potting compound 70. Power terminals 65 may pass through the protective shell 60 to create connections to power supplies and other devices. One or more wire bonds may connect device 10 to substrate metallization layers.

Figure 2A:
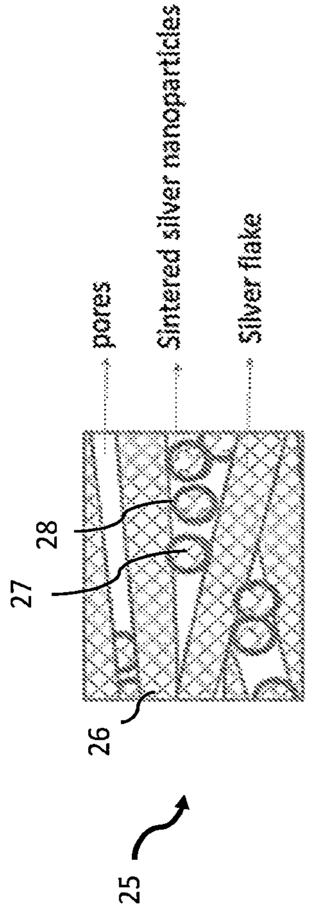
FIGS. 2A-2B are enlarged schematic depictions of an interconnection structure and bonding particle used in the packaged semiconductor device of FIG. 1.

Interconnect/die attach layer 25 is a metal layer having the microstructure depicted in FIG. 2A. The interconnect 25 includes a matrix of micron-sized silver particles 26 in an amount from approximately 10 to 60 weight percent; the micron-sized silver particles 26 have a particle size ranging from approximately 0.1 microns to 15 microns. Bonding particles are used to chemically bind the matrix of micron-sized silver particles 25. The bonding particles are core silver nanoparticles 27 with in-situ formed surface silver nanoparticles 28 (FIG. 2B) chemically bound to the surface of the core silver nanoparticles 27 and, at the same time, chemically bound to the matrix of micron-sized silver particles 26. The bonding particles have a core particle 27 size ranging from approximately 10 to approximately 100 nanometers while the in-situ formed surface silver nanoparticles 28 have a particle size of approximately 3-9 nanometers.

Figure 2B:
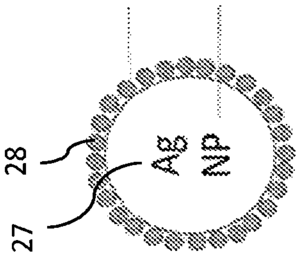

The interconnection 25 of FIGS. 2A-2B is made from a trimodal self-densifying metal interconnection paste. The term “trimodal” relates to the three types of metal particles used in the metal interconnection paste. Note that the terms “ink” and “paste” are used somewhat interchangeably in the specification; in general, a paste has a higher viscosity than an ink, which tends to be more fluid. Persons of ordinary skill in the art understand these viscosity differences and how to create a lower-viscosity ink from a higher viscosity paste (typically, through a larger percentage of solvents) In the trimodal paste micron-sized matrix metal particles are used along with bonding particles that include a metal nanoparticle core with in situ-formed smaller metal nanoparticles attached to the surface of the metal nanoparticle core. The paste includes 10-60 weight percent of approximately micron-sized matrix silver particles with an average particle size from 0.1 microns to 15 microns. The paste further includes 10-60 weight percent of bonding silver nanoparticles, the bonding silver nanoparticles having core silver nanoparticles with a core nanoparticle size of approximately 10-100 nanometers. The core silver nanoparticles have a capping polymeric layer including a silver salt precursor dissolved or suspended therein. The silver salt precursor forms the surface silver nanoparticles adhering to the surface of the core silver nanoparticles; the core silver nanoparticles will have a particle size from approximately 10 to approximately 100 nanometers. When grown, the surface silver nanoparticles, decomposed from the silver salt precursor, have a particle size of 3 to 9 nanometers bound to the silver nanoparticle 10-100 nanometer fore nanoparticle. As such, the small surface nanoparticles, with high surface energy, will more quickly melt than the core nanoparticle and the micron-sized silver matrix particles, and function as a binding agent of the core and matrix particles. The paste further includes 10-20 weight percent of at least one reductive solvent and 0.1-1 weight percent of anti-oxidization reducing agents.

Other ranges for the pastes of the present invention may also be used. For example, the paste may include 30-50 weight percent of the matrix particles, 10-30 weight percent of the bonding particles, and 20-40 weight percent of solvent. Alternatively, the paste may include 20-50 weight percent of the matrix particles, 30-40 weight percent of the bonding particles, and 20-30 weight percent of solvent. In another aspect, the paste may include 30-40 weight percent of the matrix particles, 30-40 weight percent of the bonding particles, and 10-30 weight percent of solvent. In another aspect, the paste may include 20-40 weight percent of the matrix particles, 30-50 weight percent of the bonding particles, and 10-20 weight percent of solvent.

In one aspect, the die attach/interconnect material 25 may be used to bond with a semiconductor die/device 10 having a thin metal layer 21 on a lower surface; in one embodiment, this thin metal layer may be a thin silver or thin gold layer. There may similarly be a thin metal layer 21 on an upper surface of substrate 20. Each of the thin metal layers may have a thickness of approximately 0.1 to 0.3 microns. Using thin metal layers may prevent die attach/interconnect material 25 from failing at an interface.

Materials

Micron-Sized Silver Particles

In the trimodal nano-silver paste composition of the present invention, the micron-sized silver particles preferably include at least one of silver flakes or silver approximately spherical particles having a median particle size of approximately 0.1 to 15 microns. The average particle diameter of the silver flake is preferably from 0.1 to 15 μm. When the size is lower than 0.1 μm, the bonding line structure will have a high porosity and the thermal conductivity of the silver layer will be relatively low. When the size is above 15 μm, it is difficult to dispense the silver flakes from a dispenser. Micron-scale silver flakes can establish a conductive pathway inside the bond structure at a high density. Further, the use of silver flakes provides better printability as compared to pastes using silver spherical particles.

The paste preferably contains approximately 10-60 percent by mass of silver flakes. When the amount is below 10 percent by mass, the bonding structure will show high porosity and will have a low thermal conductivity, and poor shear strength performance. If the silver flake content exceeds 60 percent by mass, the sintering structure will also show a poor shear strength since there would not be sufficient numbers of silver sintering joints formed by the silver bonding particles. In another aspect, the paste may contain 20-50 percent by mass of silver flakes, or 30-50 percent by mass of silver flakes, 20-40 percent by mass of silver flakes or 30 to 40 percent by mass of silver flakes.

Bonding Nanoparticles

Figure 5:
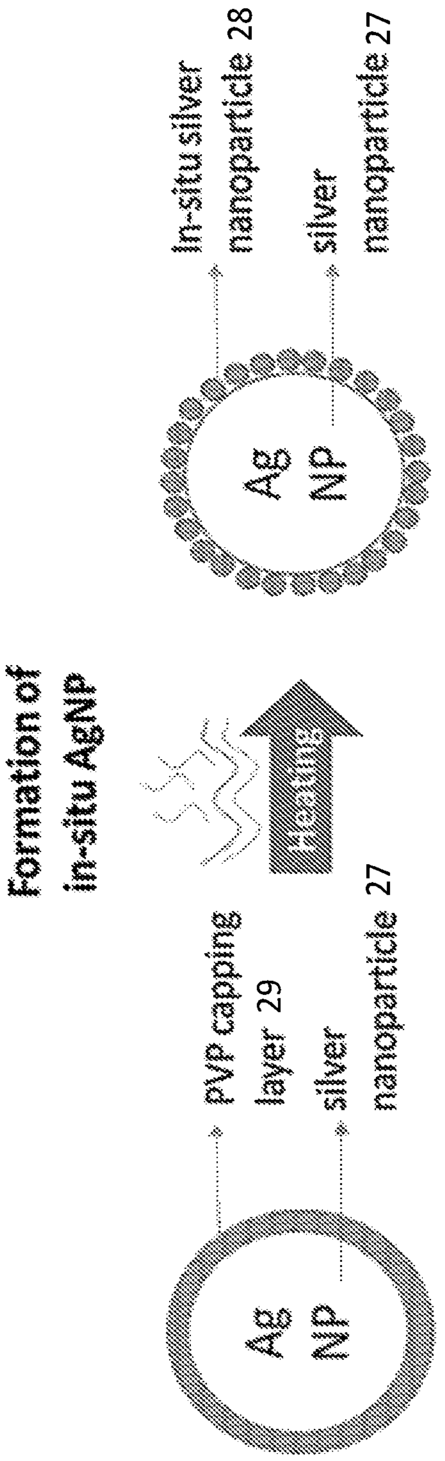
FIG. 5 shows the formation of silver nanoparticles on a core silver nanoparticle.

FIG. 5 depicts the bonding nanoparticles 27 before and after the formation of the smaller surface nanoparticles bound to the core nanoparticles. The bonding core nanoparticles 27 in the paste are approximately 10 to approximately 100 nanometer particles that are coated with a polymer 29 that has a source of silver ions contained in the polymer layer. In one aspect, polymer 29 may be polyvinylpyrrolidone (PVP) having a silver salt such as silver nitrate, silver chloride, silver acetate, or silver sulfate contained therein. The silver nanoparticles may be synthesized as set forth below:

Synthesis of a Silver Nanoparticle Mixture

1. Dissolve polyvinyl pyrrolidone (PVP) in ethylene glycol (EG) or diethylene glycol (DEG) at a temperature of 90-160° C. with mechanical agitation.
2. Add an optional reducing agent to the above PVP solution. The selection of a reducing agent and its concentration depends on the selected metal salt.
3. Dissolve a metal salt in DI water or EG solution.
4. Add the silver salt solution to the PVP solution with controlled speed.
5. Separate silver nanoparticles from solution by centrifugation after the reactions are completed.
6. Purify the nanoparticles by washing with acetone/alcohol solvents and separate by centrifugation.

Alternatively, a silver nanoparticle mixture may be formed with a catalytic reduction modifier PVP. As a protective agent, the dose and molecular weight of PVP on the morphology, dispersibility, and size of silver particles are well controlled. The molecular weight of PVP is selected to be from 10000 to 100000. When the Mw is below 10000, the low molecular weight (Mw) and low glass transition temperature (Tg), the metal salt cannot be easily controlled by the PVP as the size distribution of nano silver is wider within the process of reduction, and when the Mw larger than 100000, the molecular weight of PVP is likely to form a thread to make the nano silver tend to assemble into a wire structure. A molecular weight of 40000 is selected as the molecular weight of the PVP, the size of nano silver is well controlled as schematically indicated below:

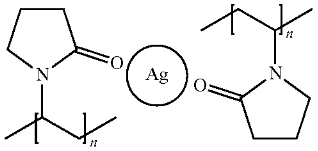

The mass fraction between the silver salt and PVP is selected to be from 1:3 to 1:7; including 1:4 to 1:6, 1:5 to 1:7, and 1:4 to 1:7.

Below 1:3, the average particle size of nano silver is too large and easily aggregates, while when more than 1:7, the modified layer of nano silver will be too thick to wash out.

The as-formed silver nanoparticle 28, as shown in FIG. 5, has an average size of 10-100 nm. The as-formed silver nanoparticle 28 with PVP capping layer 29 is washed with acetone/alcohol solvents and separated by centrifugation several times until the PVP capping layer 29 thickness is no less than approximately 3 nm and no thicker than approximately 7 nm as confirmed under TEM and SEM. The PVP capping layer synthesis with the above procedure contains the Ag ions which for the formation of the in-situ silver nanoparticles.

Reductive Solvent

An optional solvent may be used with the silver particle mixture. Any known solvent functioning as a reducing agent may be used as the solvent. This solvent is preferably a glycol-based solvent. Examples of glycol-based solvents include ethylene glycol, diethylene glycol, triethylene glycol and polyethylene glycol, propylene glycol, dipropylene glycol, etc. The trimodal nano-silver paste composition optionally includes at least one reductive solvent; the solvents may be either one of the above solvents or their combination. The amount of reductive solvent is preferably from approximately 10 to 30 percent by mass, including 10 to 20 percent by mass and 20 to 30 percent by mass.

The solvent functioning as the reducing agent not only converts silver ions to silver nanoparticles on the surface of the core silver nanoparticle, but also removes any oxidation layer on the substrate to be bonded and provides a strong connection between the bonding line layer and the substrate or the connection between the bonding line and the die. In particular, the reducing ability of the reductive solvent is further increased as the temperature increases during the curing process. Thus, the curing time may be extended during nucleation of the silver nanoparticles to obtain the maximum amount of in-situ-formed silver nanoparticles. Extending the curing time at an appropriate temperature further removes any oxidation layer from the substrate. Moreover, the reducing solvent also removes any surface coatings of the silver flake portion of the paste, for example, stearic acid or oxides. Such coatings on the silver flakes would otherwise lower the thermal conductivity of the bonding line layer. Consequently, the cured film is dense, has high electrical conductivity, and has high adhesion to the substrate and die.

Another consideration for the selection of a reductive solvent or solvents is the boiling point. Since the silver paste is sintered at temperatures of up to 260° C., the boiling point of the solvent should not exceed 260° C. Formation of in-situ silver nanoparticles occurs at a temperature between approximately 80-120° C.; therefore, selection of a reductive solvent with a boiling point over 120° C. may be desirable. Consequently, the boiling point of the solvent is selected to be approximately 120 to 260° C., and more preferably 150 to 260° C. To further extend the time for the solvent to remain in the paste to ensure sufficient time for in-situ particle formation and oxidation layer removal, the solvent may be a combination of two different solvents, each with different boiling points. Thus, the solvent will evaporate in a stepwise manner, which will also contribute to a denser bond structure.

An amount of the solvent is preferably 10 to 20 parts by mass to the silver. If this amount is less than 10 parts by mass, the viscosity increases and workability may be lower, and if it is over 20 parts by mass, the viscosity is lowered and the paste may be too thin to be printed.

Anti-Oxidation Reducing Agent

An anti-oxidation reducing agent may be added to the composition of the trimodal nano-silver paste. In the present invention, the anti-oxidization reducing agents refer to those materials having flux activity for removing an oxide coating film of a substrate, die, stearic acid coating on the surface of micron-sized silver particles, and the residual PVP coating on the silver nanoparticles. It also prevents the substrate surface from being re-oxidized during elevated temperature curing. A clean substrate surface will contribute to the mechanical strength at the interface and avoid crack formation. Further, a clean surface of the micron-sized silver particles will contribute to high thermal conductivity. Examples of anti-oxidization reducing agents include citric acid, caffeic acid, malic acid and dicarboxylic acids such as ethanedioic acid, propanedioic acid, butanedioic acid, pentanedioic acid, hexanedioic acid, heptanedioic acid, octanedioic acid, nonanedioic acid, decanedioic acid, etc. The amount of anti-oxidization reducing agent is preferably from approximately 0.1 to 1 percent by mass. If the amount is less than 0.1%, there will be no reducing effect and if the amount of anti-oxidization reducing agents exceeds 1 percent by mass, the thermal conductivity of the bond will be reduced. The decomposition temperature of the anti-oxidization reducing agents should be no more than 200° C. such that the reducing agent is removed at 150-200° C. before the silver sintering process starts. Failure to remove the reducing agent prior to sintering may negatively impact the bond, leading to poor shear strength.

Optional Non-Conductive Filler

The trimodal nano-silver paste composition of the present invention may optionally include a non-conductive filler. The non-conductive filler may be selected from one or more of SiC, $SiO_2$, $TiO_2$, $Al_2O_3$, or other ceramic and polymer particles such as silicone resin microspheres that are stable at sintering temperature. The purpose of adding non-conductive filler to the paste is to densify the paste structure and avoid aggregation of the voids under the grain growth process, which will have a negative influence on both shear strength and thermal conductivity. The addition of non-conductive particles improves the high-temperature stability and high-hydrothermal stability of the sintered nano-silver joints. It may also limit thermal resistance increase during thermal cycling between low and high temperature. Shear strength increases with an increasing proportion of SiC in the trimodal nano-silver paste. The size of the non-conductive filler particles is preferably between approximately 50-1000 nm. The amount of non-conductive filler particles, when present, is preferably 0.1 to 1 percent by mass to 100 parts by mass of the trimodal nanosilver paste components.

The Step-Curing Densification Method

Figure 6:
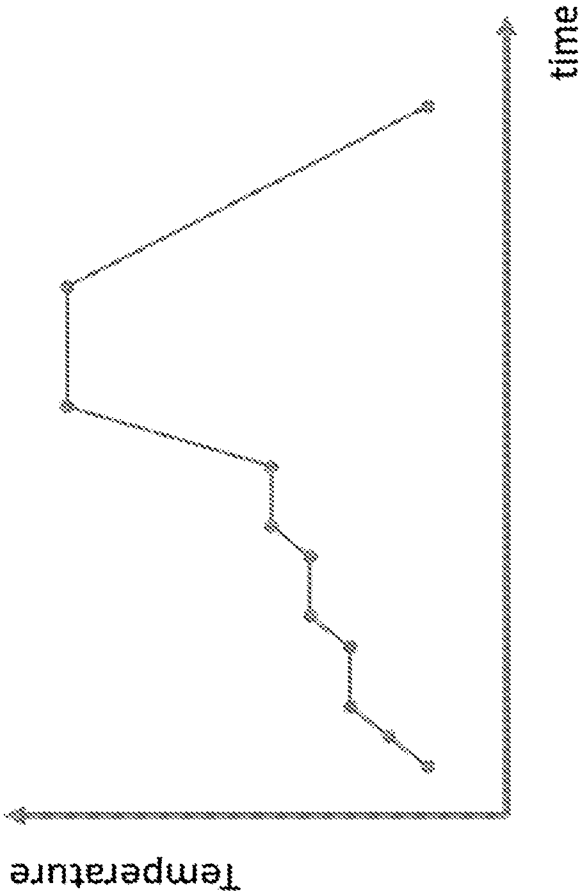
FIG. 6 shows a curing profile used in the present invention.

In another aspect, the present invention provides a multi-step curing process that self-densifies the metal paste and permits the formation of a strong bond at low temperature without the need for the application of pressure during bonding. The multi-step curing method includes (S1) a step for in-situ silver nanoparticle formation, (S2) a step for removing the oxidation layer of the micron-sized silver particles and bonding silver nanoparticles, (S3) a step for removing the residual anti-oxidation reducing agents, and (S4) a step for sintering of the silver nanoparticles. FIG. 6 schematically depicts the multi-step curing method of the present invention. Accordingly, the multi-step curing method of the trimodal nanosilver paste provides a dense bond structure between the die and substrate without the need for application of external pressure during bonding.

Figure 7:
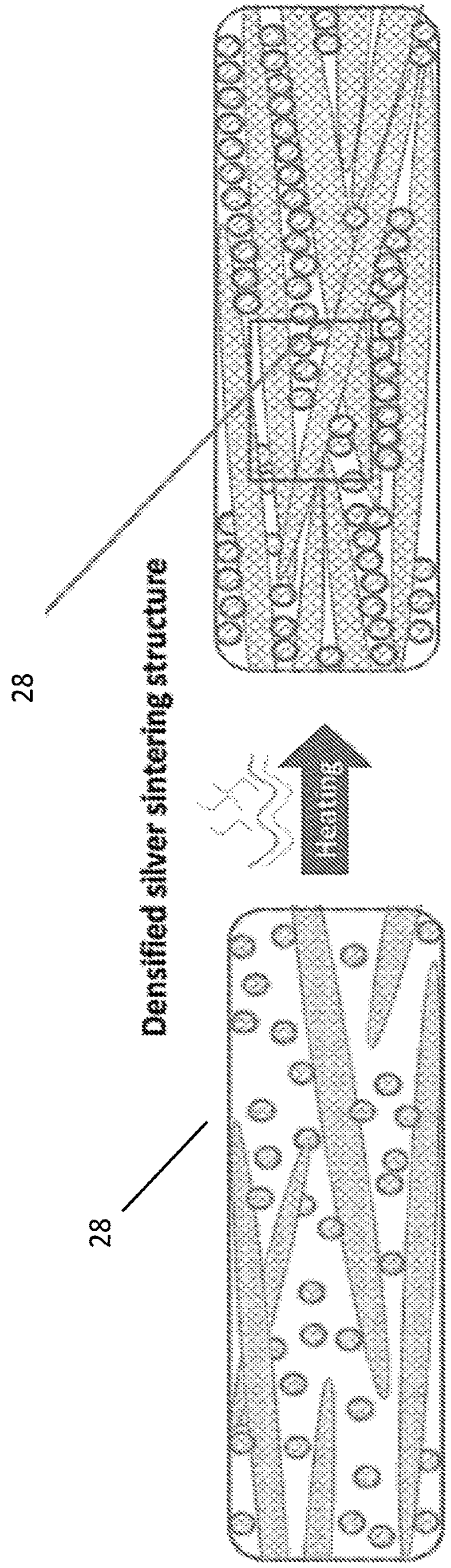
FIG. 7 shows the bonding of micron-sized silver particles by nanometer-scale particles.

The first step creates in-situ silver nanoparticles from metal salt in the polymer layer surrounding the core nanoparticles; the formation temperature is between approximately 80~120° C. for a period of approximately 10-30 mins. The second step removes an oxidation layer from the substrate and the organic layer on the micron-sized silver flakes/spherical silver particles; the temperature is between approximately 120~150° C. for a time period of approximately 10-30 mins. The third step removes the residual anti-oxidation reducing agents; the temperature is between approximately 150~200° C. for a time period of approximately 10-30 mins. The fourth step sinters the silver nanoparticles; the temperature is between approximately 200-260° C. for a time period of approximately 30-90 mins. FIG. 7 schematically depicts the particles in a solvent followed by the particles binding to the micron-sized silver particles as the solvent is removed.

Using the inventive trimodal nanosilver paste composition and the multi-step curing method, in-situ silver nanoparticles form around the central bonding nanoparticle from the polymer/PVP coating containing silver salt. With the presence of glycol-based solvents which also act as reducing agents, there will be a certain amount of small-sized silver nanoparticles (3-9 nm) generated on the surface of the bonding nanoparticles, forming a shell of smaller nanoparticles on a core larger nanoparticle as seen in FIG. 5. Importantly, the small nanoparticles 28 are chemically bonded to the base silver nanoparticle 27 prior to sintering to the larger, micron-sized silver flakes/spherical silver particles.

The composition is optimized to ensure a high packing density. Due to the slow removal of the solvent materials during the multi-step curing and sintering process, voids created by vaporization/decomposition of solvents/additives are filled by silver nanoparticles 27. That is, the structure is self-densifying due to its high packing density and the multi-step curing process. When trimodal nano-silver paste is sintered in the final step of the curing/sintering process, voids rarely form due to the densified structure formed during removal of the solvents and additive in steps 2 and 3. The in-situ formed silver nanoparticles sinter at a low temperature (approximately 112° C.) and act as metal adhesives on the silver nanoparticles so that the silver nanoparticles form strong bonds with the silver flakes/spherical silver particles. The silver nanoparticles act as strong bonding particles among the larger micron-sized particles. The final bond structure of three kinds of silver particles is shown in FIG. 2A.

EXAMPLE 1: Synthesis of PVP Capped Silver Nanoparticle 36.4 g of polyvinyl pyrrolidone (Mw: 50000) was dissolved in 75 mL of ethylene glycol with magnetic stirring while heated to 120° C., 5.8 g of silver nitrate was dissolved in 25 mL of ethylene glycol. The silver nitrate solution was added to PVP solution and the reaction mixture was stirred for 1 hour before cooling down to room temperature. After completion of the reaction, the mixture was centrifuged out at 10000 rpm and washed with ethanol and acetone. The purified silver nanoparticles were not dried, but kept in an ethanol environment for subsequent ink/paste formulation.

EXAMPLE 2: The Formulation of Trimodal Nano-Silver Paste

Several compositions were formed according the present invention as well as comparative compositions as set forth in the Table below. As seen in the table below, the compositions according to the present invention exhibit substantially higher thermal conductivity, and higher shear strength before and after thermal aging. Additionally, there is lower porosity and lower resistivity in the example compositions compared to prior art compositions.

TABLE 2

Examples of Specific Formulations:

| | Example | | | | | Comparative | | | |
|---|---|---|---|---|---|---|---|---|---|
| | 1 | 2 | 3 | 4 | 5 | 1 | 2 | 3 | 4 |
| Silver flakes | 60 | 60 | 60 | 70 | 70 | 60 | 60 | 60 | 60 |
| Synthesised AgNP | 40 | 40 | 40 | 30 | 30 | 40 | | 40 | 40 |
| Commercialized AgNP | | | | | | | 40 | | |
| EG | 10% | 5% | | 4% | | | 5% | 5% | 5% |
| DEG | | 5% | 5% | 3% | 10% | | 5% | 5% | 5% |
| TEG | | | 5% | 3% | | | | | |
| DBE | | | | | | 10% | | | |
| Citric Acid | 0.7% | 0.7% | 0.7% | 0.7% | 1% | | 0.7% | 0.7% | 1% |
| Caffeic acid | | | | | | | | | |
| hydroxybutanedioic acid | 0.3% | 0.3% | 0.3% | 0.3% | | | 0.3% | 0.3% | |
| SiC powder | | 0.1% | | | | | 0.1% | | |
| Organosilicone resin powder | | | 0.1% | | | | | | |
| P1 | ✓ | ✓ | ✓ | ✓ | ✓ | ✓ | ✓ | | |
| P2 | | | | | | | | ✓ | |
| P3 | | | | | | | | | ✓ |
| Porosity | <25% | <20% | <20% | <25% | <25% | >35% | >35% | >35% | >30% |
| Electric Resitivity [Ω · cm] | 4.60E−06 | 5.50E−06 | 5.50E−06 | 5.50E−06 | 5.00E−06 | 8.00E−06 | 1.20E−05 | 1.00E−05 | 5.70E−06 |
| Thermal conductivity [W/m · K] | 200 | 170 | 150 | 180 | 190 | 100 | 90 | 92 | 120 |
| Shear strength before thermal aging [Mpa] | 37 | 33 | 35 | 30 | 32 | 19 | 20 | 17 | 29 |
| Shear strength after 1000 h thermal aging [Mpa] | 31 | 32 | 34 | 29 | 30 | n/a | n/a | n/a | 24 |
| Themal resistance increase after 1000 thermal cycles (−55 to 150° C.) | >25% | <25% | <25% | >25% | >25% | >25% | >25% | >25% | >25% |

*Step-curing profile: The step-curing densification method disclosed above.

Control Curing profile:

P2: Directly curing under 260° C.

P3: Equilibrium at 30° C., raising temperature at a speed of 10° C./min to 130° C., Isothermal for 30 min, raising temperature at a speed of 10° C./min to 260° C., Isothermal for 60 min.

INDUSTRIAL APPLICABILITY

The trimodal nano-silver paste of the present invention combined with the step-curing densification/bonding method may be used in pressure-free sintering and, optionally, sintering with pressure application. The bond demonstrates excellent adhesion between the semiconductor component and the substrate. The bond also shows excellent shear strength and has both high thermal conductivity and high thermal stability during high temperature aging tests.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated.

The invention claimed is:

1. A self-densifying interconnection between a high-temperature semiconductor device selected from GaN or SiC and a substrate comprising:

a matrix of micron-sized silver particles in amount from approximately 10 to 60 weight percent, the micron-sized silver particles having a particle size ranging from approximately 0.1 microns to 15 microns;

bonding particles fused to the matrix of micron-sized silver particles comprising core silver nanoparticles with smaller in-situ formed surface silver nanoparticles chemically bound to the surface of the core silver nanoparticles and chemically bound to the matrix of micron-sized silver particles, the bonding particles having a core particle size ranging from approximately 10 to approximately 100 nanometers, the in-situ formed surface silver nanoparticles having a particle size of approximately 3-9 nanometers;

wherein the self-densifying interconnection has a porosity below 25%.

2. The self-densifying interconnection of claim 1, wherein the micron-sized silver particles are selected from silver flakes or approximately spherical silver particles.

3. The self-densifying interconnection of claim 1, wherein the substrate includes a layer of silver or gold having a thickness of approximately 0.1 to 0.3 micron.

4. A trimodal self-densifying silver interconnection paste comprising 10-60 weight percent of approximately micron-sized matrix silver particles with average particle size from 0.1 micron to 15 microns;

10-60 weight percent of bonding silver nanoparticles, the bonding silver nanoparticles having core silver nanoparticles with a core nanoparticle size of approximately 10-100 nanometers, the core silver nanoparticles having a capping polymeric layer including a silver salt precursor dissolved or suspended therein, the silver salt precursor forming surface silver nanoparticles adhering to the surface of the core silver nanoparticles having a particle size from approximately 10 to approximately 100 nanometers;

10-20 weight percent of at least one reductive solvent;

0.1-1 wt % of anti-oxidization reducing agents;

wherein the trimodal self-densifying silver interconnection paste has a porosity below 25%.

5. The trimodal silver interconnection paste of claim 4, further comprising 0.1-1 weight percent of a non-conductive filler.

6. The trimodal silver interconnection paste of claim 4, wherein the approximately micron-sized matrix silver particles are selected from silver flakes or approximately spherical silver particles.

7. The trimodal silver interconnection paste of claim 4, wherein the capping polymeric layer is polyvinyl pyrrolidone.

8. The trimodal silver interconnection paste of claim 4, wherein the silver salt is selected from one or more of silver nitrate, silver chloride, silver acetate, or silver sulfate.

9. The trimodal silver interconnection paste of claim 4, wherein the at least one reductive solvent is selected from one or more or ethylene glycol, diethylene glycol, triethylene glycol and polyethylene glycol.

10. The trimodal silver interconnection paste of claim 4, wherein the anti-oxidization reducing agent is selected from one or more of citric acid, caffeic acid, malic acid, or a dicarboxylic acid.

11. The trimodal silver interconnection paste of claim 5, wherein the non-conductive filler is selected from one or more of SiC, $SiO_2$ or $Al_2O_3$, $ZrO_2$, silicone resin microsphere particles, or other ceramic and polymer particles that are stable at sintering temperature.

* * * * *